(12) United States Patent
Minamio et al.

(10) Patent No.: US 7,547,955 B2
(45) Date of Patent: Jun. 16, 2009

(54) SEMICONDUCTOR IMAGING DEVICE AND METHOD FOR MANUFACTURING THE SAME

(75) Inventors: Masanori Minamio, Osaka (JP);
Tomoko Komatsu, Kyoto (JP);
Toshiyuki Fukuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 124 days.

(21) Appl. No.: 11/700,124

(22) Filed: Jan. 31, 2007

(65) Prior Publication Data
US 2007/0228502 A1 Oct. 4, 2007

(30) Foreign Application Priority Data
Mar. 29, 2006 (JP) ............................. 2006-090433

(51) Int. Cl.
*H01L 27/15* (2006.01)
(52) U.S. Cl. ................. 257/432; 257/433; 257/434; 257/680; 257/E31.117; 257/E31.127
(58) Field of Classification Search ................. 257/432, 257/433, 434, 680, E31.117, E31.127
See application file for complete search history.

(56) References Cited

U.S. PATENT DOCUMENTS 6,556,349 B2 * 4/2003 Cox et al. .................... 359/626
6,583,438 B1 * 6/2003 Uchida ........................ 257/59
2002/0163054 A1 * 11/2002 Suda .......................... 257/431

FOREIGN PATENT DOCUMENTS

JP 9-260624 10/1997
JP 2003-244558 * 8/2003

* cited by examiner

*Primary Examiner*—Ngan Ngo
*Assistant Examiner*—Benjamin Tzu-Hung Liu
(74) *Attorney, Agent, or Firm*—McDermott Will & Emery LLP

(57) ABSTRACT

A semiconductor imaging device includes: a semiconductor imaging element including an imaging region, a peripheral circuit region, and an electrode region, the imaging region including a plurality of micro lenses; a semiconductor package the semiconductor package in which a cavity for mounting the semiconductor imaging element is formed, the semiconductor package including a plurality of internal connection terminals formed inside the periphery of the cavity for being connected with a plurality of electrode terminals of the semiconductor imaging element and a plurality of external connection terminals connected with the internal connection terminals; a fixing member for fixing the semiconductor imaging element to the cavity; and an optical member fixed to the semiconductor package by a sealing member so as to cover the semiconductor imaging element arranged in the cavity. Wherein, a face obtained by connecting vertexes of the micro lenses is formed into a continuous concave curve.

7 Claims, 12 Drawing Sheets

SEMICONDUCTOR IMAGING DEVICE AND METHOD FOR MANUFACTURING THE SAME

CROSS REFERENCE TO RELATED APPLICATIONS

This Non-provisional application claims priority under 35 U.S.C. §119(a) on U.S. patent application Ser. No. 2006-090433 filed in Japan on Mar. 29, 2006, the entire contents of which are hereby incorporated by reference.

BACKGROUND OF THE INVENTION

The present invention relates to a semiconductor imaging device including micro lenses at the surface thereof, and particularly relates to a semiconductor imaging device that suppresses image failure caused due to field curvature and a method for manufacturing it.

Recently, as demand for high-density packaging of semiconductor components increases in association with reduction in size and thickness of electronic appliances, novel structures and manufacturing methods are being examined for attaining a high-quality, small-size, and thin semiconductor imaging devices in which semiconductor imaging elements are incorporated.

In general, a semiconductor imaging device is so structured that micro lenses of convex lenses are provided on a light receiving face for increasing sensitivity of the semiconductor imaging device to focus incident light on the light receiving face for effective light collection. In the semiconductor imaging device, an optical lens system is arranged in front of the imaging face. The arrangement of the optical lens system in front of the imaging face, however, involves blurring of an image and color bleeding, which are caused due to field curvature. Though the shape of the lenses and the diaphragm of the optical lens system are optimized for preventing blurring and bleeding, such countermeasures on the optical lens system itself make the shape of the lenses and the structure as a whole to be complicated and invite an increase in cost. For this reason, structures and methods which achieve compensation of the field curvature of the optical lens system at lower cost are desired.

In response to the above desire, a method has been proposed as a first example in which a semiconductor imaging element having a thickness of 20 µm or smaller in a bear chip state is allowed to adhere and be fixed to a mounting concave portion of a wiring substrate (see Patent Document 1: Japanese Patent Application Laid Open Publication No. 2003-244558A). The mounting concave portion is formed in, for example, an arc shape or a spherical curved shape at a predetermined curvature, and the semiconductor imaging element is fitted along the mounting concave portion to be in a shape curved at a predetermined curvature. For obtaining such a thin film semiconductor imaging device, the document also discloses a method in which after forming a solid-state imaging element on an epitaxial layer grown on a porous silicon layer provided on a silicon substrate, the silicon substrate is separated at the porous silicon layer.

With the above structure, a semiconductor imaging device including a curved semiconductor imaging element can be realized easily at good yield, and an electronic appliance in which it is incorporated can be reduced in size.

Referring to a second example, there has been proposed micro lenses that can compensate the field curvature of an optical lens system and a method of manufacturing them (see, for example, Patent Document 2: Japanese Patent Application Laid Open Publication No. 9-260624A). In this method, a lens formation layer is etched with the use of resist patterns having convex portions each for each pixel as masks. Therefore, appropriate selection of the etching method, for example, etching at an etching rate to the resist pattern substantially equal to that to the lens formation layer forms the lens formation layer having the same convex portions as the resist patterns. Further, the resist patterns are patterned so as to have analog patterns and so that the areas of patterns arranged in the peripheral part of the imaging face become larger than those arranged in the central part of the imaging face. Accordingly, when the lens formation layer is etched with the use of the resist patterns having such the patterns as masks, the micro lenses are formed so that the curvatures of the convex lenses arranged in the peripheral part of the imaging face are larger than the curvatures of the convex lenses arranged in the central part thereof.

With the micro lenses having the structures in which the convex lenses arranged in the peripheral part of the imaging face have curvatures larger than the convex lenses arranged in the central part thereof, when the curvatures of the convex lenses are made correspondence with the optical lens system arranged in front of the semiconductor imaging element, aberration of the field curvature of the optical lens system can be compensated by the micro lenses.

In the semiconductor imaging device of the first example, however, the curved shape is obtained by bending the semiconductor imaging element by pushing the upper surface of the semiconductor imaging element physically by means of a pressing jig including an elastic pad in packaging the semiconductor imaging element. This method means that the surfaces of the micro lenses made of transparent resin are pressed by the pressing jig at heating for fixing the semiconductor imaging element by an adhesive onto a wiring substrate, inviting deformation of the surfaces of the micro lenses, adhesion of minute dust, and the like. This requires the pressing step to be performed in clean environment. Further, the semiconductor imaging element processed to be thin, approximately 20 µm must be handled and presses against the mounting concave portion so as not to generate a crack under adequate management, which leads to poor productivity.

Referring to the second example, which is a method in which the curvatures of the micro lenses are changed, thinning the semiconductor imaging element and strict process management in the adhesion step as in the first example are unnecessary. Formation of the resist patterns having the patterns of the convex portions for the respective pixels, however, requires melting of the resist patterns so that the central part of each pixel is upwardly convex by its surface tension. Further, etching must be performed under the condition where the etching rate to the resist patterns is substantially equal to that to the lens formation layer. In order to satisfy these requirements, the materials of the resists and the lens formation layer are limited. Moreover, patterning must be performed so as to set the areas of the resist patterns arranged in the peripheral part of the imaging face on the light receiving section are larger than those of the resist patterns arranged in the central part of the imaging face thereon. The difference in shape of the resist patterns leads to complicated design for shape and the like in the central part of the light receiving section and in the peripheral part thereof.

SUMMARY OF THE INVENTION

The present invention has its object of providing a compact and thin semiconductor imaging device especially with shading suppressed by setting the structures of curved micro lenses so as to have the same outer dimension and so that a face obtained by connecting the vertexes of the micro lenses is formed into a continuous concave curve from the central part of an imaging region toward the outermost periphery thereof.

To solve the above problems, a semiconductor imaging device according to one aspect of the present invention includes: a semiconductor imaging element including an imaging region, a peripheral circuit region, and an electrode region, the imaging region including a plurality of micro lenses; a semiconductor package in which a cavity for mounting the semiconductor imaging element is formed, the semiconductor package including a plurality of internal connection terminals formed inside the periphery of the cavity for being connected with a plurality of electrode terminals of the semiconductor imaging element and a plurality of external connection terminals connected with the internal connection terminals for being connected with an external instrument; a fixing member for fixing the semiconductor imaging element to the cavity; and an optical member fixed to the semiconductor package by a sealing member so as to cover the semiconductor imaging element arranged in the cavity, wherein in the semiconductor imaging element, a face obtained by connecting vertexes of the micro lenses is formed into a continuous concave curve where a micro lens at the center of the imaging region has the smallest curvature while micro lenses at the outermost periphery thereof have the largest curvature and thickness at vertexes of the micro lenses increases continuously from the micro lens at the center to the micro lenses at the outermost periphery.

With the above arrangement, a shading phenomenon, which darkens the peripheral part of an object of an image with image quality lowered, can be prevented, attaining a clear and excellent image.

In the above arrangement, the semiconductor imaging element may be fixed in the cavity in a curved state with a central part of the imaging region as a center.

In this case, a region of the cavity of the semiconductor package where the semiconductor imaging element may be fixed has a concave surface while the semiconductor imaging element is fixed along the concave surface of the cavity.

Alternatively, it is possible that a recess in a shape corresponding to at least the imaging region and a plurality of trenches having the same depth as the recess for connecting the recess and an edge of the semiconductor imaging element is formed in an opposite surface portion of the semiconductor imaging element to a surface portion where the imaging region is formed and the semiconductor imaging element is fixed in the cavity in a curved state with a central part of the recess as a center.

Further, it is possible that: in the cavity of the semiconductor package, there are formed an element position restricting step at the bottom thereof for restricting a position of the semiconductor imaging element and an element fixing step inside the element position restricting step which has a shape corresponding to at least the imaging region of the semiconductor imaging element and which has a depth larger than the bottom of the element position restricting step and the semiconductor imaging element is fitted in the element position restricting step and fixed to the element fixing step in a curved state with a central part of the element fixing step as a center.

With any of the above arrangements, a concave shape is formed by a combination of the concave curve formed by the micro lens group and the concave surface of the semiconductor imaging element itself to prevent the shading phenomenon which darkens the peripheral part of an object of an image with image quality lowered. Further, in any of these cases, the curvature of the curved semiconductor imaging element may be smaller than that in the case where image strain caused due to lens aberration is reduced by the curve of only the semiconductor imaging element. This means easy adhesion and fixation of the curved semiconductor imaging element and suppression of variation in curvature in use. For making the semiconductor imaging element to be curved, for example, the fixing member may be applied to four points at the edge of the semiconductor imaging element and one point at the central part thereof so as to utilize shrinkage stress of the fixing member, which is caused due to difference in thickness of the fixing member between at the central part and at the edge.

Further, each of the plurality of the micro lenses may be made of a material softened by the volatile component contained in the fixing member. In this case, each of the plurality of the micro lenses may be made of acryl-based resin, and the fixing member may contain at least one selected from the group of liquid epoxy-based resin, liquid polyimide-based resin, and liquid acryl-based resin as a base compound and N-methyl-2-pyrolidone (hereinafter referred to as NMP) as a solvent.

With any of the above arrangements, when the micro lenses are softened and deformed with the semiconductor imaging element sealed to the semiconductor package, the micro lens group can form a concave curve as a whole. As a result, the shading phenomenon, which darkens the peripheral part of an object of an image with image quality lowered, can be prevented, attaining a clear and excellent image.

Moreover, in the above arrangement, the plurality of micro lenses formed in the imaging region may have the same outer dimension. Alternatively, the sealing member may be made of a material hardened by a ultraviolet ray and heating. Further, the optical member may be made of any of glass, quartz glass, epoxy resin, acryl resin, and polyimide resin which are transparent with respect to at least visible light.

To solve the above described problems, a method for manufacturing a semiconductor imaging element according to one aspect of the present invention includes the steps of: applying, to the bottom of a cavity formed in a central part of a semiconductor package, a fixing member which releases a volatile component that softens micro lenses at a temperature at which a sealing member is heat hardened; placing on and fixing to the fixing member the semiconductor imaging element including an imaging region where the micro lenses are formed; connecting a plurality of electrode terminals of the semiconductor imaging element to internal connection terminals arranged inside the periphery of the cavity through metal thin lines; applying onto a sealing face of the semiconductor package the sealing member having a property of being hardened by a ultraviolet ray and heating; placing an optical member on the sealing face and pre-hardening the sealing member, as a first hardening step, by irradiating a ultraviolet ray to the sealing member through the optical member; and heating the semiconductor package, as a second hardening step after the first hardening step, for heat hardening the sealing member and for releasing the volatile component from the fixing member to deform the micro lenses continuously from a lens at the center of the imaging region to lenses at the outermost periphery of the imaging region so that a face obtained by connecting vertexes of the micro lenses is formed into a continuous concave curve where the micro lens at the center of the imaging region has the smallest curvature while the micro lenses at the outermost periphery of the imaging region have the largest curvature and vertex thickness increases continuously from the micro lens at the center to the micro lenses at the outermost periphery.

In the above method, the micro lenses uniform in shapes are formed at a stage of a semiconductor wafer, and a diced semiconductor imaging element is sealed to a semiconductor package and then is heated. As a result, the face obtained by connecting the vertexes of the micro lenses is formed into a continuous concave curve where the vertex thickness is the smallest at the center and the largest at the outermost periphery. This prevents the shading phenomenon, which darkens the peripheral part of an object of an image with image quality lowered, attaining a clear and excellent image. In addition, a semiconductor imaging device having the concave curve can be manufactured easily.

In the above method, the semiconductor package may have a concave surface in a region of the cavity where the semiconductor imaging element is fixed while the semiconductor imaging element may be fixed along the concave surface of the cavity in the step of fixing the semiconductor imaging element.

Alternatively, the method may further include the step of forming, in an opposite surface portion of the semiconductor imaging element to a surface portion where the imaging region is formed, a recess in a shape corresponding to at least the imaging region and a plurality of trenches having the same depth as the recess for connecting the recess and an edge of the semiconductor imaging element, wherein in the step of fixing the semiconductor imaging element, the semiconductor imaging element is fixed in the cavity in a curved state by shrinkage stress of the fixing member at fixing.

Furthermore, there may be formed in the semiconductor package an element position restricting step at the bottom of the cavity for restricting a position of the semiconductor imaging element and an element fixing step inside the element position restricting step which has a shape corresponding to at least the imaging region of the semiconductor imaging element and which has a depth larger than the bottom of the element position restricting step, wherein the semiconductor imaging element may be fitted in the element position restricting step and is fixed to the element fixing step in a curved state by shrinkage stress of the fixing member at fixing in the step of fixing the semiconductor imaging element.

According to any of the above methods, the semiconductor imaging element itself has a concave surface as well as the micro lenses form a concave curve as a whole, further suppressing image strain.

In the above method, acryl-based resin may be used as a material of the micro lenses, and the fixing member may contain at least one selected from the group of liquid epoxy-based resin, liquid polyimide-based resin, and liquid acryl-based resin as a base compound and N-methyl-2-pyrolidone as a solvent. Moreover, the second hardening step may be performed at a temperature lower than a temperature at which the fixing member is hardened for a time period longer than a time period for which the fixing member is hardened.

As described above, in the semiconductor imaging device and the manufacturing method thereof according to one aspect of the present invention, which is a simple process, the face obtained by connecting the vertexes of the micro lenses on the light receiving face is formed into a continuous concave curve, so that the shading phenomenon, which darkens the peripheral part of an object of an image with image quality lowered, can be prevented to attain a clear and excellent image.

DESCRIPTION OF PREFERRED EMBODIMENTS

Figure 1A:
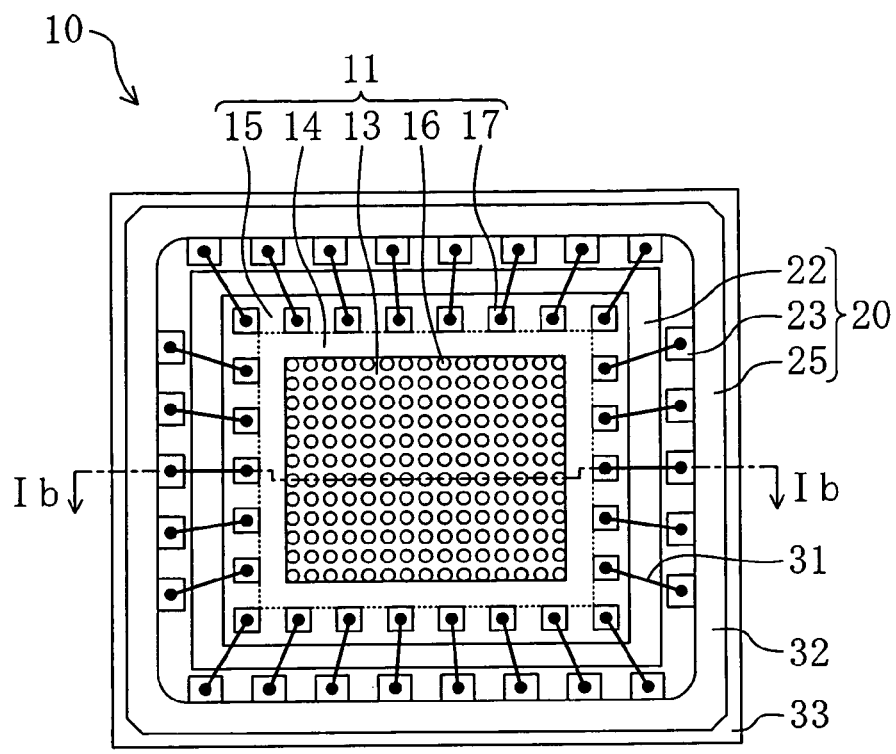
FIG. 1A is a view for explaining a structure of a semiconductor imaging device according to Embodiment 1 of the present invention and is a plan view when viewed through an optical member.

Embodiments of the present invention will be described below with reference to the accompanying drawings. In the drawings, the thickness, the length, and the like are different from actual ones for the sake of drawing drafting. As well, the numbers of semiconductor imaging elements and terminals of a semiconductor package are different from actual ones and are set for easy drawing drafting. The same reference numerals are assigned to the same elements for omitting description in some cases.

Embodiment 1

Figure 1B:
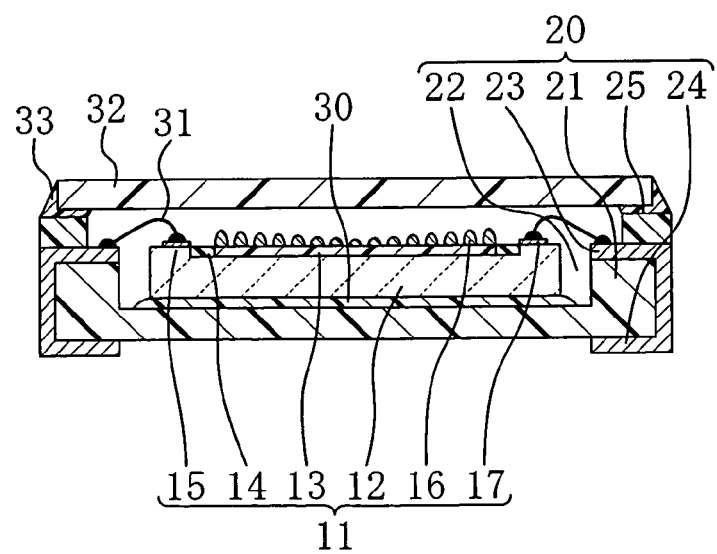
FIG. 1B is a sectional view taken long the line Ib-Ib in FIG. 1A.

FIG. 1 shows a structure of a semiconductor imaging device 10 according to Embodiment 1 of the present invention, wherein FIG. 1A is a plan view when viewed through an optical member 32, and FIG. 1B is a sectional view taken long the line Ib-Ib in FIG. 1A.

In a semiconductor imaging device 10 of the present embodiment, a semiconductor imaging element 11 includes an imaging region 13, a peripheral circuit region 14, and an electrode region 15, wherein a plurality of micro lenses 16 are provided in the imaging region 13. Though the peripheral circuit region 14 and the electrode region 15 cannot be separated clearly in some cases, a region where a plurality of electrode terminals 17 are formed is called the electrode region 15 while a region between the electrode region 15 and the imaging region 13 where various circuits are formed is called the peripheral circuit region 14 in the present embodiment.

In a semiconductor package 20 for accommodating the semiconductor imaging element 11, a cavity 22 is formed for mounting the semiconductor imaging element 11 at a base 21, and there are provided a plurality of internal connection terminals 23 formed inside the periphery of the cavity 22 for being connected with the electrode terminals 17 of the semiconductor imaging element 11 and a plurality of external connection terminals 24 connected with the internal connection terminals 23 for being connected with an external instrument (not shown).

In the cavity 22, there are provided a fixing member 30 for fixing the semiconductor imaging element 11 and an optical member 32 allowed to adhere to the semiconductor package 20 by a sealing member 33 so as to cover the semiconductor imaging element 11 arranged in the cavity 22.

The semiconductor imaging element 11 has a face obtained by connecting the vertexes of the micro lenses 16 which is formed into a continuous concave curve where a micro lens 161 at the center of the imaging region 13 has the smallest thickness while micro lenses 168 at the outermost periphery thereof have the largest thickness so that the vertex thickness increases continuously from the micro lens 161 at the center to the micro lenses 168 at the outermost periphery. In other words, the micro lenses 16 form a concave curve as a whole, and the curvature of the micro lens 161 at the center is the smallest while the curvature of the micro lenses 168 at the outermost periphery is the largest. In the present embodiment, the micro lenses 16 including the micro lens 161 at the center and the micro lenses 168 at the outermost periphery have the same outer dimension.

The semiconductor imaging device 10 of the present embodiment will be described further in detail below.

First, the semiconductor imaging element 11 includes the imaging region 13, the peripheral circuit region 14, and the electrode region 15, which are formed in a semiconductor substrate 12. The micro lens 16, which is made of acryl based transparent resin prepared by using, for example, propylene glycol monomethyl ether acetate (hereinafter referred to as PGMEA), is arranged on each pixel of a light receiving section of the imaging region 13. A silicon mono-crystalline substrate is used as the semiconductor substrate 12 in general, and the electrode terminals 17 and the like of the imaging region 13, the peripheral circuit region 14, or the electrode region 15 can be prepared by known semiconductor techniques. As well, the micro lenses 16 can be prepared by a method generally employed for semiconductor imaging elements.

The peripheral circuit region 14 includes a plurality of circuit blocks (not shown) for transmitting electric signals from the pixels to corresponding electrode terminals 17. The electrode region 15 includes the plurality of electrode terminals 17 for transmitting electric signals transmitted from the circuit blocks formed in the peripheral circuit region 14 to corresponding internal connection terminals 23 of the semiconductor package 20.

The semiconductor package 20 is in a rectangular shape in projection, and a cavity 22 is formed in the upper part thereof except the periphery thereof. In the cavity 22, the plurality of internal connection terminals 23 are provided inside the periphery thereof, and a concave portion having an outer dimension larger than the semiconductor imaging element 11 is formed inside the peripheral region where the internal connection terminals 23 are formed. The internal connection terminals 23 are connected to the electrode terminals 17 of the semiconductor imaging element 11 through metal thin lines 31. The portion of the cavity 22 where the internal connection terminals 23 are formed is set so as to have the same thickness as the semiconductor imaging element 11.

Further, the internal connection terminals 23 are connected to the external connection terminals 24 provided at the outer bottom of the semiconductor package 20. In the present embodiment, the internal connection terminals 23 extend directly and are connected to the external connection terminals 24 at the bottom of the semiconductor package 20 via wiring patterns formed at the side faces of the semiconductor package 20. The present embodiment is, however, not limited to this arrangement. For example, the internal connection terminals 23 and the external connection terminals 24 may be connected through through-type conductors in which a conductive material is filled.

The base 21 of the semiconductor package 20 may be a resin base of, for example, epoxy resin, glass epoxy resin, aramid resin, or the like, or an alumina ceramic base, or may be made of a metal material on the surface of which an insulating coating film is formed, or the like. Of all, the ceramic base, such as an alumina ceramic base and the like is excellent in sealing characteristic and is one of favorable bases. For the internal connection terminals 23 and the external connection terminals 24, a laminated structure may be employed in which a gold (Au) thin film is formed on the surface of, for example, copper (Cu), nickel (Ni), or the like. With the laminated structure, bonding strength of wire bonding increases with a small conductive resistance. Further, connection reliability increases in the case where the external connection terminals 24 are connected to an external instrument by soldering or the like.

The electrode terminals 17 are connected to the internal connection terminals 23 through the metal thin lines 31 by, for example, wire bonding, wherein the metal thin lines 31 may be gold (Au) lines, copper (Cu) lines, or aluminum (Al) lines.

The optical member 23 may be made of glass, quartz glass, epoxy resin, acryl resin, or polyimide resin, which are transparent with respect to at least visible light. To do so, the respective faces must be processed at high accuracy in flatness and degree of parallelization. The optical member 32 has a dimension smaller than the outer dimension of the semiconductor package 20 and is large enough to be placed on a sealing face 25 of a member formed on the internal connection terminals 23. The optical member 32 is placed on and fixed to the sealing face 25 by the sealing member 33.

At the bottom of the cavity 22 of the semiconductor package 20, the semiconductor imaging device 11 is fixed by a fixing member 30 made of epoxy-based resin, polyimide-based resin, acryl-based resin, or the like as a base compound with which, for example, N-methyl-2-pyrrolidone (hereinafter referred to as NMP) is blended as a solvent. NMP as the solvent is volatilized in the step of heating the semiconductor package 20, so that the fixing member 30 contains no or less NMP in the final step and thereafter.

Further, the sealing member 33 is made of a material which is hardened by a ultraviolet ray and heating and may be, for example, epoxy-based resin, polyimide-based resin, acryl-based resin, or the like.

With the above structure, the semiconductor imaging element 11 is mounted, first hardening by ultraviolet irradiation is performed on the optical member 32, and then, second hardening by heating is performed on the semiconductor package 20, so that, the micro lenses 16 of the semiconductor imaging element 11 fixed to the cavity 22 of the semiconductor package 20 form a concaved face as whole where the vertex thickness is the smallest at the center of the imaging region 13 and increases gradually toward the periphery thereof. Specifically, the thickness and the shapes of micro lenses 16 are less changed in the peripheral part and are changed gradually toward the central part to cause sagging, thereby thinning the micro lenses 16 in the central part and decreasing the curvature thereof.

Figure 3A:
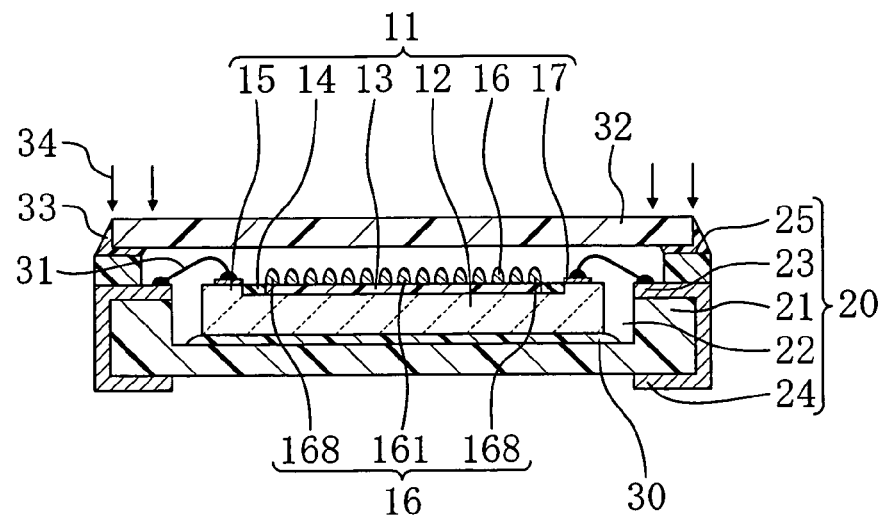
FIG. 3A and FIG. 3B are views for explaining the semiconductor imaging device manufacturing method according to Embodiment 1.
Figure 3B:
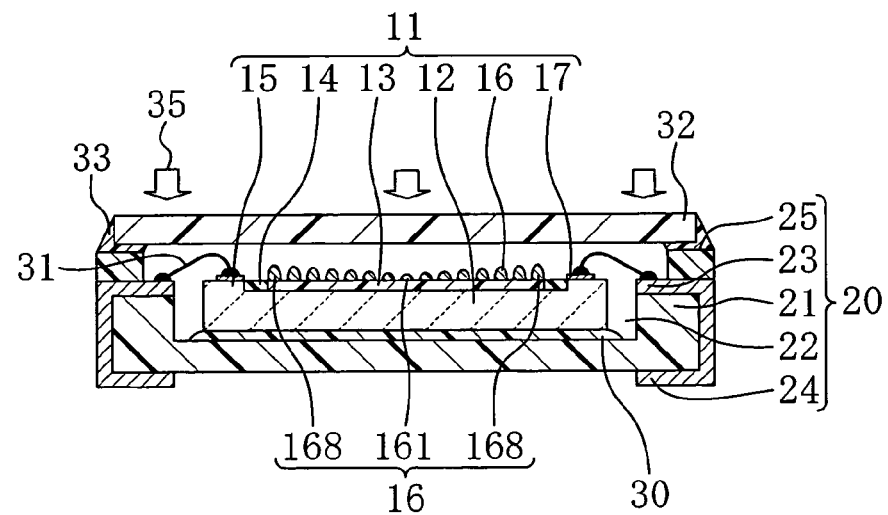
Figure 4A:
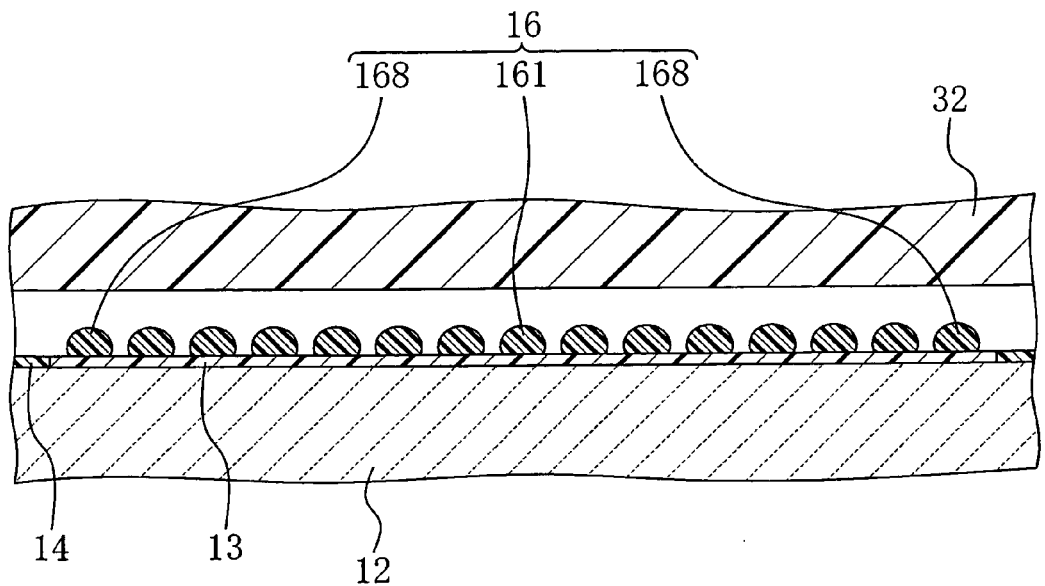
FIG. 4A is an enlarged schematic view of a micro lens region which corresponds to FIG. 3A.
Figure 4B:
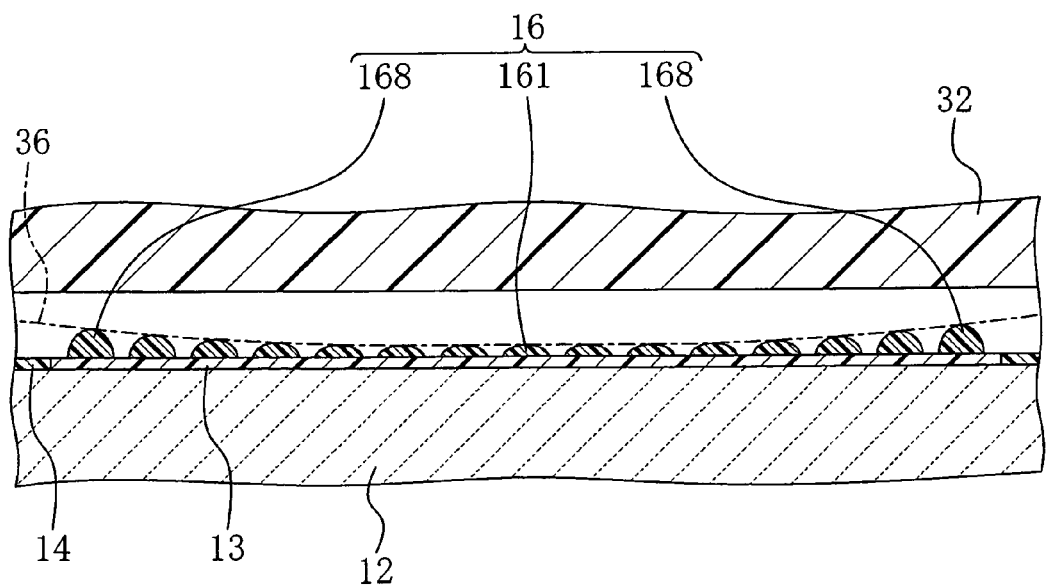
FIG. 4B is an enlarged schematic view of the micro lens region which corresponds to FIG. 3B.

A method for manufacturing the semiconductor imaging device 10 of the present embodiment will be described below with reference to FIG. 2 to FIG. 4. FIG. 2 and FIG. 3 are views for explaining the method for manufacturing the semiconductor imaging device 10 of the present embodiment and correspond to the section taken along the line Ib-Ib in FIG. 1A. FIG. 4A is an enlarged schematic view of a micro lens region corresponding to FIG. 3A, and FIG. 4B is an enlarged schematic view of the micro lens region corresponding to FIG. 3B.

Figure 2A:
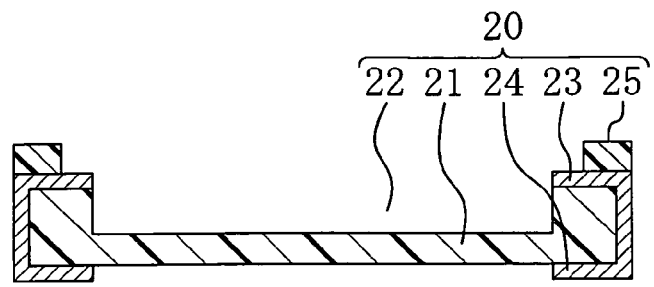
FIG. 2A to FIG. 2C are views for explaining a semiconductor imaging device manufacturing method according to Embodiment 1.

First, as shown in FIG. 2A, the semiconductor package 20 in a rectangular shape in projection is prepared in which the cavity 22 larger than the outer dimension of the semiconductor imaging element 11 is formed and which includes the internal connection terminals 23, the external connection terminals 24 connected to the internal connection terminals 23, and the sealing face 25. The present embodiment describes the case where the base 21 of the semiconductor package 20 is formed of an alumina ceramic base.

Figure 2B:
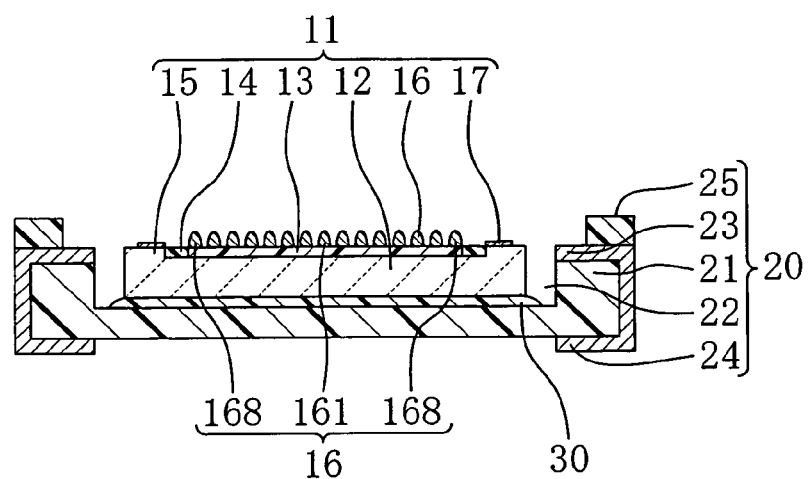

Next, as shown in FIG. 2B, the fixing member 30 made of epoxy-based resin with which NMP is blended as a solvent is applied onto a bottom part of the cavity 22 of the semiconductor package 20 by, for example, a dispenser. The area where the fixing member 30 is applied may have the same area as the semiconductor imaging element 11, or the fixing member 30 may be applied at one or a plurality of points. Then, the semiconductor imaging element 11 is pressed on the fixing member 30 for placement, and then, is subjected to heat hardening at a temperature between 150° C. and 190° C., preferably at 170° C. for five minutes in a non-oxidation atmosphere, for example, a nitrogen gas. It should be noted that the above hardening conditions are mere examples and may be changed appropriately according to the size of the semiconductor package 20, the material of the fixing member 30, and the like. Wherein, the temperature and the time period should be set so as not to volatilize thoroughly the solvent, such as NMP.

The semiconductor imaging element 11 used in this case has the following structure. Namely, the micro lens 16 is formed on each pixel in the imaging region 13 by using acryl-based transparent resin with which, for example, PGMEA is blended as a solvent. Typical conditions for making the acryl-based transparent resin to be lenses are: a treatment temperature between 180° C. and 200° C.; a treatment time period for five minutes; and a treatment atmosphere of a non-oxidation atmosphere such as a nitrogen gas atmosphere. Treatment under the above conditions softens the acryl-based transparent resin, thereby forming the micro lenses 16 in carved shapes. More preferably, the treatment temperature is set to 200° C. Thereafter, the resin is diced into pieces to obtain the semiconductor imaging elements 11. It should be noted that the treatment temperature, the treatment time period, and the treatment atmosphere are mere examples and are set so that layers to be the micro lenses are melted to have curved shapes.

Figure 2C:
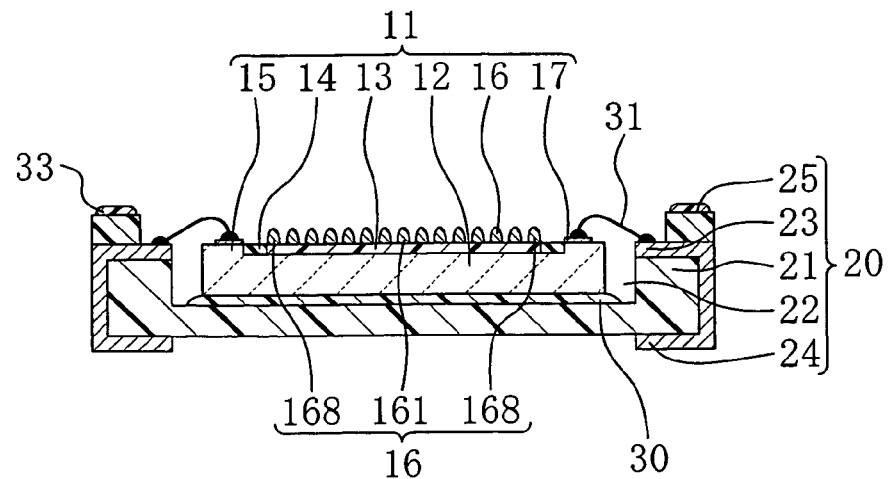

Subsequently, as show in FIG. 2C, the electrode terminals 17 arranged in the electrode region 15 of the semiconductor imaging element 11 are connected to the internal connection terminals 23 formed inside the periphery of the cavity 22 of the semiconductor package 20 through the metal thin lines 31 by, for example, a wire bonder. Gold (Au) lines, copper (Cu) lines, or aluminum (Al) lines may be used as the metal thin lines 31, for example. The wire bonder may be of thermal compression bonding type, ultrasonic thermal compression bonding type, ultrasonic compression bonding type, or the like. Then, the sealing member 33 made of thermoplastic liquid epoxy-based resin is applied onto the sealing face 25 of the semiconductor package 20 by, for example, a dispenser. The sealing member 33 may be made of acryl-based resin or polyimide-based resin.

Thereafter, as shown in FIG. 3A, the optical member 32 is pressed on the sealing member 33 applied on the sealing face 25 of semiconductor package 20 for placement, and is subjected to the first hardening by irradiating a ultraviolet ray 34. The first hardening is performed by, for example, irradiating a ultraviolet ray at approximately 2 joules and further irradiating a ultraviolet ray at approximately 10 joules. In the present embodiment, Pyrex (registered trademark) glass is used as the optical member 32.

Next, as shown in FIG. 3B, the second hardening for sealing the semiconductor package 20 with the sealing member 33 is performed in such a manner that the sealing member 33 is hardened by heating at a temperature between 110° C. and 130° C., preferably 120° C. for 60 minutes in dry air or a nitrogen gas with the use of, for example, an infrared heater 35. Through the second hardening, the micro lenses 16 in the central part of the imaging region 13 are deformed and become thin to have small curvatures. On the other hand, the micro lenses 16 in the peripheral part thereof are less deformed, so that the micro lenses 16 form a concave curve as a whole. With this concave curve, the amount of incident light at the light receiving section increases as it goes toward the outer periphery, minimizing shading.

The following is considered as a mechanism which forms the concave curve as a whole where the curvatures of the deformed micro lenses 16 in the central part have smaller curvatures while the micro lenses 16 in the outer peripheral part are less deformed.

The first hardening shown in FIG. 3A involves no increase in temperature within the cavity 22 of the semiconductor package 20. In the first hardening, though the optical member 32 is fixed to the semiconductor package 20, the air-tightness by the sealing member 33 is insufficient yet. Accordingly, the inside of the cavity 22 is in an equilibrium state in temperature, moisture, and pressure to the state at irradiation of the ultraviolet ray 34 or is equal in temperature, moisture, and pressure (an equilibrium state) to the outside according to the elapse of time from the first hardening. Under this state, the micro lenses 16 in the central part and the micro lenses 16 in the peripheral part of the micro lenses 16 remain in the same shape, as shown in FIG. 4A.

Subsequently, in the second hardening shown in FIG. 3B, the temperature in the cavity 22 of the semiconductor package 20 rises to 120° C. to cause degasification of moisture and the like adhering to the surface of the inside region surrounded by the optical member 32 and the cavity 22 and evaporation of NMP contained in the fixing member 30. Particularly, the fixing member 30 is only heated for five minutes at 170° C., which is below the boiling point, 204° C., of NMP as a solvent, and therefore, a considerable amount of NMP remains in the fixing member 30. For this reason, NMP in the fixing member 30 is evaporated to be a volatilization component in 60-minute heating at 120° C., which are the conditions for the second hardening, thereby spreading in the cavity 22. Wherein, NMP may not be evaporated constantly during the 60-minute heating, namely, almost all NMP would be evaporated from the first to a certain time in the heating and volatilization thereafter would be less.

Referring to the sealing member 33, the air tightness is insufficient at an initial stage of the heating, and the inside gas is released outside through the sealing member 33 in association with pressure rise inside the cavity 22. In other words, NMP evaporated at the initial stage diffuses and spreads in the cavity 22, and then, part thereof passes through and comes out from the sealing member 33. For this reason, the concentration of NMP is maintained high at the central part of the imaging region 13 while being reduced as it goes toward the outer periphery. In response to this concentration distribution, the micro lenses 16 in the central part is swelled and softened to a large extent and the degree of softening becomes smaller as it goes toward the outer periphery.

In the cavity 22, the air therein is released through the sealing member 33, so that the pressure becomes high at the central part of the imaging region 13 and is reduced as it goes toward the electrode region 15.

According to the difference in softening degree of the micro lenses 16 and the pressure distribution, the face obtained by connecting the vertexes of the micro lenses 16 is formed into a continuous concave curve with the center of the imaging region 13 as a center where the vertex thickness is the smallest at the micro lens 161 at the center of the imaging region 13 and is the largest at the micro lenses 168 at the outermost periphery thereof.

When the air-tightness increases and the air inside the cavity 22 does come out therefrom as cross-linking of the sealing member 33 progresses, the pressure in the cavity 22 becomes uniform as a whole. In this case, however, the softening degrees of the micro lenses 16 are different, and therefore, deformation of the micro lenses 16 in the central part progresses while the micro lenses 16 in the outer peripheral part are less deformed even under the same pressure. Hence, the micro lenses 16 in the central part are deformed further even in the air-tight state.

According to the above described phenomenon, as shown in FIG. 4B, the micro lenses 16 in the central part are softened and becomes thin to have small curvatures. While in the micro lenses 16 in the outer peripheral part remain substantially in the initial shape thereof. Namely, a concave curve 36, which is a collection of segments formed by connecting the vertexes of the micro lenses 16, is formed continuously from the central part to the outer periphery. In other words, the concave curve is obtained as a whole.

Another cause of the phenomenon that the micro lenses are deformed may be considered as follows.

In the first hardening for sealing the optical member 32, no temperature rise is involved within the cavity 22 of the semiconductor package 20, and the inside of the cavity 22 is in an equilibrium state in temperature, moisture, and pressure to the state at the sealing step. Then, in the second hardening, the temperature inside the cavity 22 of the semiconductor package 20 rises to 120° to cause degasification of moisture and the like adhering to the surface of the inside region surrounded by the optical member 32 and the cavity 22 and evaporation of NMP contained in the fixing member 30.

Particularly, the fixing member 30 is only heated for five minutes at 170° C., which is below the boiling point, 204° C., of NMP as a solvent, and therefore, a considerable amount of NMP remains in the fixing member 30. For this reason, NMP in the fixing member 30 is evaporated to be a volatilization component in 60-minute heating at 120° C., which are the conditions for the second hardening, thereby spreading in the cavity 22. Wherein, NMP may not be evaporated constantly during the 60-minute heating, namely, almost all NMP would be evaporated from the first to a certain time in the heating and volatilization thereafter would be less.

The micro lenses 16 made of acryl-based transparent resin is formed into a state before completely hardened with heat resistances of the respective materials of the semiconductor imaging element 11 taken into consideration. For this reason, in the second hardening for 60 minutes at 120° C., NMP in the fixing member 30 is evaporated to remain in the cavity 22 in proportion to the partial pressure at 120°. The air enters into the micro lenses 16 made of acryl-based transparent resin, causing swelling from the surface of the resin to be softened. In cooling from this state, the semiconductor imaging element 11 is cooled from the periphery thereof by heat conduction from the semiconductor package 20 and convection and heat conduction of the air in the cavity 22 surrounding the semiconductor imaging device 11, and finally, the central part thereof is cooled to the room temperature. Local difference in cooling speed of the micro lenses 16 and the pressure distribution caused thereby in the cavity 22 maintain high temperature in the central part up to the end, namely, PGMEA, NMP, and the moisture keep the pressure therein high. As a result, the group of the micro lenses 16 in the imaging region 13 has a smallest thickness at the central part with deformation of the micro lenses 16 suppressed more in the peripheral part. This may be similar to a phenomenon called sink in which the central part in the upper and lower faces of a semiconductor package are recessed the most when the semiconductor package including neither a semiconductor element nor a lead frame is made of epoxy resin and is transfer-formed with the use of a resin molding dies.

Embodiment 2

Figure 5A:
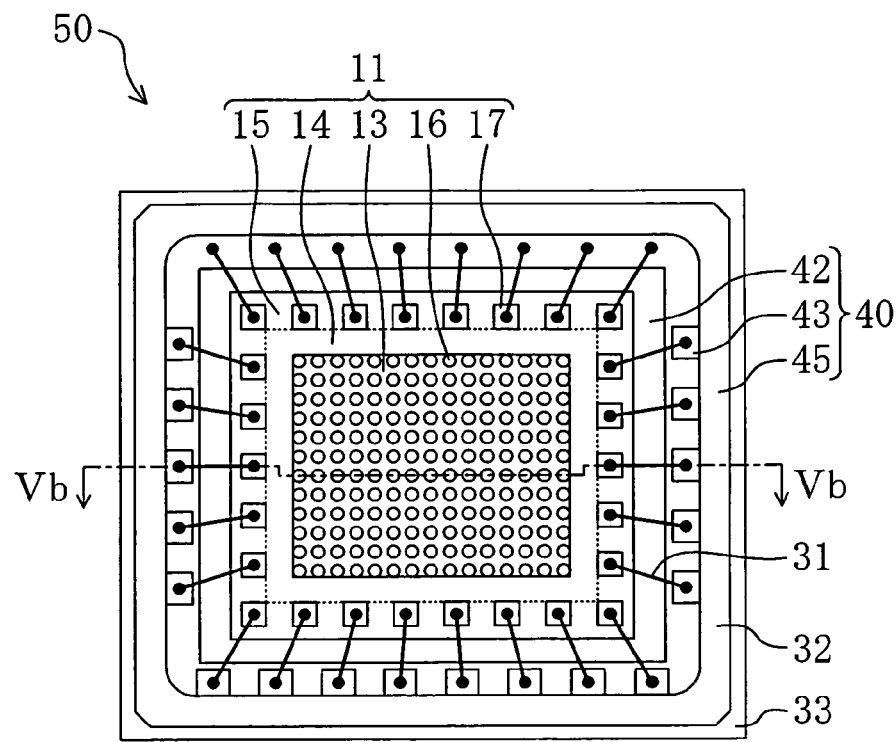
FIG. 5A is a view for explaining a structure of a semiconductor imaging device according to Embodiment 2 of the present invention and is a plan view when viewed through the optical member.
Figure 5B:
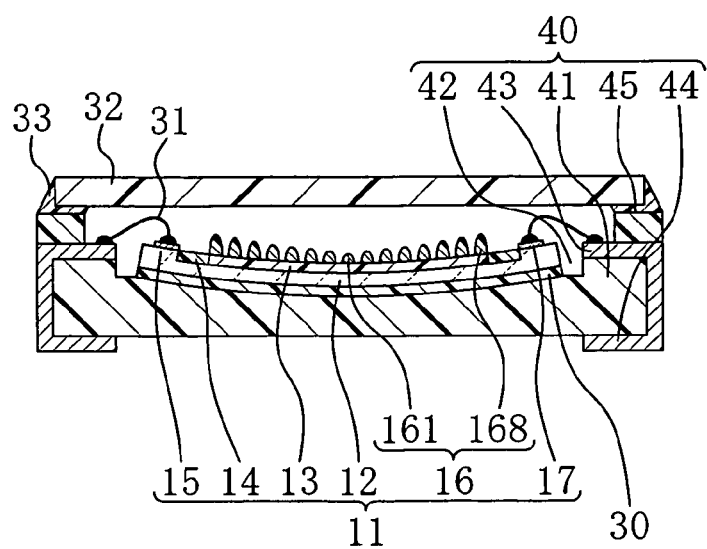
FIG. 5B is a sectional view taken long the line Vb-Vb in FIG. 5A.

FIG. 5 shows a structure of a semiconductor imaging device 50 according to Embodiment 2 of the present invention, wherein FIG. 5A is a plan view when viewed through the optical member 32, and FIG. 5B is a sectional view taken long the line Vb-Vb in FIG. 5A.

In the semiconductor imaging device 50 of the present embodiment, a region of a cavity 42 of a semiconductor package 40 where the semiconductor imaging element 11 is fixed has a concave surface, and the semiconductor imaging element 11 is fixed along the concave surface of the cavity 42, which is the difference from the semiconductor imaging device 10 of Embodiment 1. Further, in the present embodiment, the semiconductor imaging element 11 used in Embodiment 1 is thinned for being fixed easily along the concave surface of the cavity 42, which is the difference from Embodiment 1. The other features are the same as those of the semiconductor imaging device 10 of Embodiment 1.

The semiconductor package 40 is the same in shape as that in Embodiment 1 as a whole, and includes the cavity 42 for mounting the semiconductor imaging element 11, a plurality of internal connection terminals 43 formed inside the periphery of the cavity 42 for being connected with the plurality of electrode terminals 17 of the semiconductor imaging element 11, and a plurality of external connection terminals 44 connected with the internal connection terminals 43 for being connected with an external instrument (not shown). A base 41 of the semiconductor package 40 is made of, for example, a ceramic material. The shape of the sealing face 45 of a member for sealing the optical member 32 is the same as that of the semiconductor package 20 in Embodiment 1. Wherein, in the semiconductor package 40, a region for mounting the semiconductor imaging element 11 is processed to have a concave surface, as shown in FIG. 5B.

The semiconductor imaging element 11 has the same structure as that in Embodiment 1 and has a thin thickness of approximately 50 μm to 100 μm as a whole so as to be easily fitted to the concave surface.

In the semiconductor imaging element 11 of the semiconductor imaging device 50 of the present embodiment, the plurality of micro lenses 16 on the imaging region 13 each have curved surfaces so that the face obtained by connecting the vertexes of the micro lenses 16 is formed into a continuous concave curve where the vertex thickness is the smallest at the micro lens 161 at the center of the imaging region 13 and is the largest at the micro lenses 168 at the outermost periphery thereof. In other words, the micro lenses 16 form, as a whole, a concave curve where the micro lens 161 at the center has the smallest curvature while the micro lenses 168 at the outermost periphery have the largest curvature. Wherein, in the present embodiment, the micro lenses 16 including the micro lens 161 at the center and the micro lenses 168 at the outermost periphery have the same outer dimension.

Further, the semiconductor imaging element 11 itself is fixed along the concave surface of the cavity 42 of the semiconductor package 40. With the above arrangement, the concave curve of the imaging region 13 including the micro lenses 16 can be set further arbitrarily. Hence, the structures of the lenses can be simplified, with a result that a compact semiconductor imaging device 50 can be achieved.

In the present embodiment, the micro lenses 16 form the concave curve as a whole, and accordingly, the curvature of the curved semiconductor imaging element 11 may be set smaller. As a result, the semiconductor element may have a thickness larger than a conventional semiconductor imaging element, hardly causing a crack and the like of the semiconductor imaging element in a handling operation such as mounting to the semiconductor package and the like. In contrast, in the case of a semiconductor imaging element having the same thickness as that of the conventional one, the concave surface of the cavity 42 of the semiconductor package 40 can have a smaller curvature, so that the semiconductor imaging element 11 can be fixed along the concave surface easily by shrinking action by hardening of the fixing member 30 at fixing by the fixing member 30. Further, defects, such as falling off of the semiconductor imaging element 11 from the fixing member 30 in use hardly occurs, attaining a highly reliable semiconductor imaging device.

A method for manufacturing the semiconductor imaging device 50 of the present embodiment is the same as the manufacturing method in Embodiment 1, and therefore, description thereof is omitted. In the step of fixing the semiconductor imaging element 11, pressure by, for example, high pressure air may be applied so that the semiconductor imaging element 11 is fitted along the concave surface. Alternatively, the semiconductor imaging element 11 may be fitted along the concave surface by utilizing shrinking force at hardening of the fixing member 30.

In Embodiment 1 and Embodiment 2, acryl-based transparent resin prepared by using PGMEA is used as a material of the micro lenses, but the present invention is not limited thereto. For example, acryl-based resin of polyglycine methacrylate (PGMA) or the like may be used. Alternatively, photosensitive novolac resin or the like may be used. To use the photosensitive novolac resin, it is necessary to add to the fixing member a volatile component for swelling and softening the novolac resin.

Embodiment 3

Figure 6A:
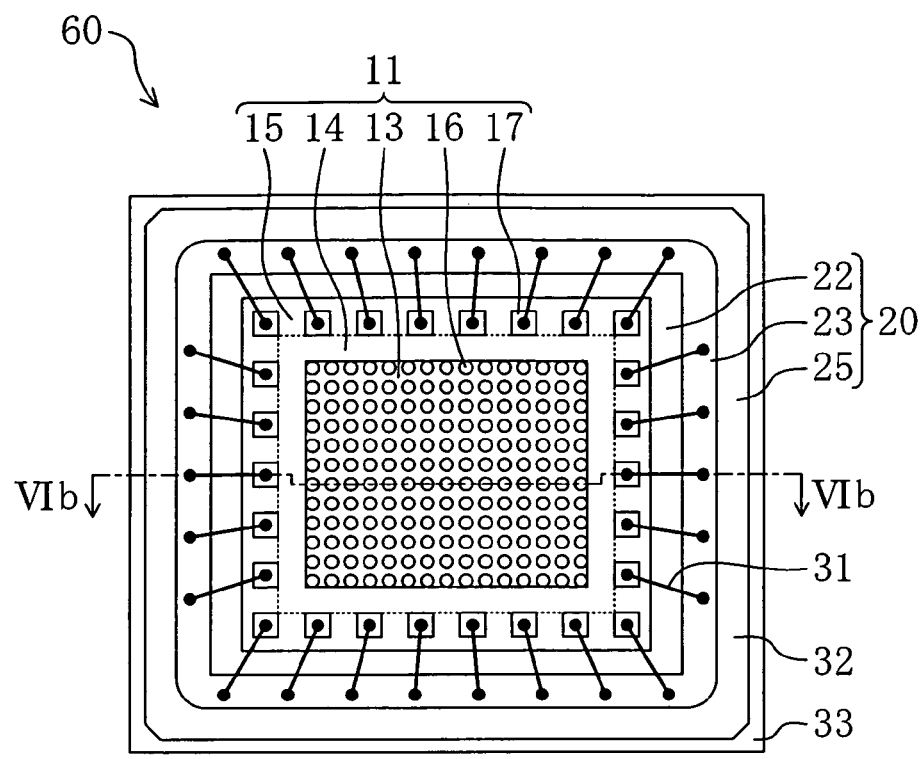
FIG. 6A is a view for explaining a structure of a semiconductor imaging device according to Embodiment 3 of the present invention and is a plan view when viewed through the optical member.
Figure 6B:
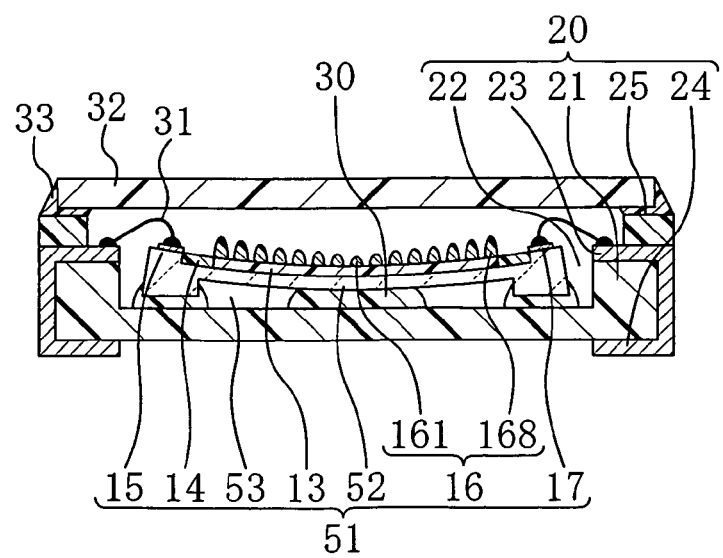
FIG. 6B is a sectional view taken long the line VIb-VIb in FIG. 6A.
Figure 7A:
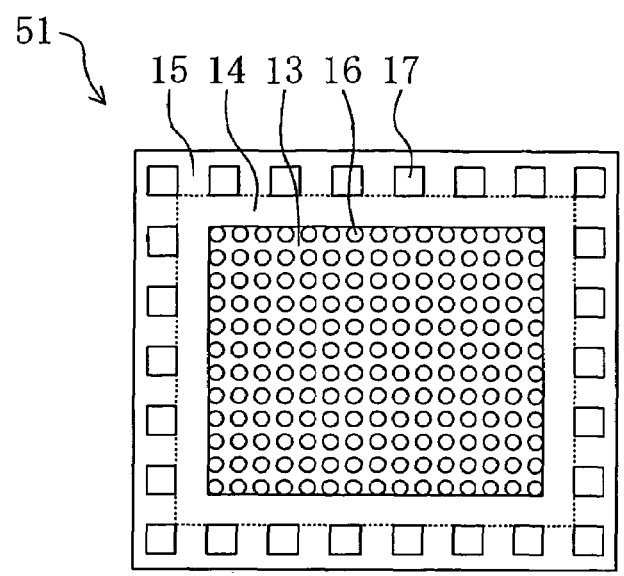
FIG. 7A is a view showing a structure of a semiconductor imaging element used in the semiconductor imaging device of Embodiment 3 and is a plan view when viewed from the micro lenses side.
Figure 7B:
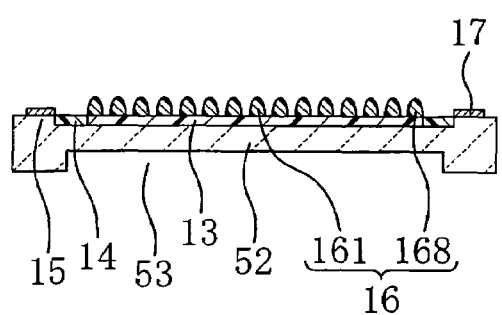
FIG. 7B is a sectional view.
Figure 7C:
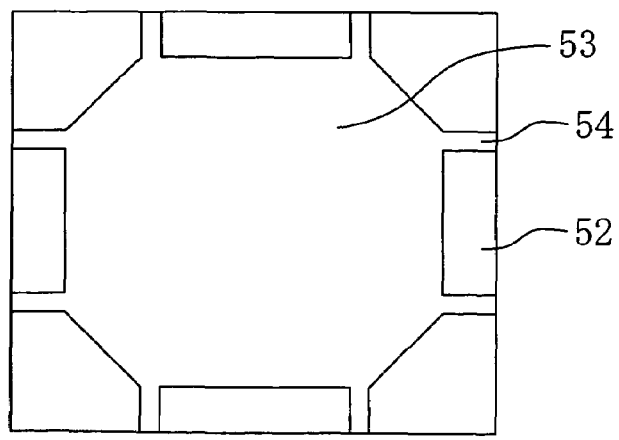
FIG. 7C is a plan view when viewed from the reverse side.

FIG. 6 shows a structure of a semiconductor imaging device 60 according to Embodiment 3 of the present invention, wherein FIG. 6A is a plan view when viewed through the optical member 32, and FIG. 6B is a sectional view taken long the line VIb-VIb in FIG. 6A. Further, FIG. 7 shows a structure of a semiconductor imaging element 51 used in the semiconductor imaging device 60, wherein FIG. 7A is a plan view when viewed from the micro lenses 16 side, FIG. 7B is a sectional view, and FIG. 7C is a plan view when viewed from the reverse side.

In the semiconductor imaging device 60 of the present embodiment, a recess 53 having a shape corresponding to at least the imaging region 13 and a plurality of trenches 54 having the same depth as the recess 53 for connecting the recess 53 and the edge of the semiconductor imaging element 51 are formed in the surface portion of a semiconductor substrate 52 on the opposite side to the surface portion in which the imaging region 13 of the semiconductor imaging element 51 is formed, and the semiconductor imaging element 51 is fixed to the cavity 22 in a state curved with the center of the recess 53 as a center, in other words, with the center of the imaging region 13 as a center. The other features are the same as those of the semiconductor imaging device 10 of Embodiment 1.

In detail, the recess 53 slightly larger in area than the imaging region 13 of the semiconductor imaging element 51 is formed in the reverse face portion of the semiconductor substrate 52, and the trenches 54 having the same depth as the recess 53 are formed around the recess 53 from the recess 53 to the edge of the semiconductor imaging element 51. The semiconductor imaging element 51 having the reverse face portion in this structure is mounted at the cavity 22 of the semiconductor package 20 described in Embodiment 1. In this mounting, the semiconductor imaging element 51 sealed in the semiconductor package 20 is curved, so that the face obtained by connecting the vertexes of the micro lenses 16 is formed into a continuous concave curve with the center of the imaging region 13 as a center where the vertex of the micro lens 161 at the center of the imaging region 13 is the lowest while the vertexes of the micro lenses 168 at the outermost periphery thereof is the highest.

The structure of the semiconductor imaging device 60 of the present embodiment will be described in detail below. Wherein, the semiconductor package 20, the micro lenses 16 on the semiconductor imaging element 51, the fixing member 30, the sealing member 33, the optical member 32, and the like may be the same as those in Embodiment 1, and therefore description thereof is omitted herein. Difference of the semiconductor imaging device 60 of the present embodiment from the semiconductor imaging device 10 of Embodiment 1 lies in that the recess 53 and the trenches 54 for dividing the periphery thereof are formed in the reverse face portion corresponding to the imaging region 13 of the semiconductor imaging element 51 in the present embodiment.

A structure of the semiconductor imaging element 51 used in the semiconductor imaging device 60 of the present embodiment will be described. In the principal face of the semiconductor imaging element 51, there are formed the imaging region 13, the peripheral circuit region 14, and the electrode region 15, wherein the micro lens 16 made of acryl-based transparent resin is provided on each pixel in the imaging region 13. The thickness of the semiconductor imaging element 51 is 100 µm to 800µ, preferably, 400 µm. The recess 53 having a depth of 20 µm to 250 µm, preferably, 120 µm and ranging slightly wider than the imaging region 13 is formed in the reverse face portion of the semiconductor imaging element 51. In the thick region around the recess 53, the plurality of trenches 54 are formed so as to connect the recess 53 and the edge of the semiconductor imaging element 51. The depth of the trenches 54 is equal to that of the recess 53, and the width of the trenches 54 is 30 µm to 200 µm.

The semiconductor imaging element 51 having the above structure is fixed at a predetermined position of the semiconductor package 20, wherein the semiconductor imaging element 51 can be curved by action of the fixing member 30. In detail, the fixing member 30 is applied on four points at the periphery and one point at the center of the region of the cavity 22 of the semiconductor package 20 where the semiconductor imaging element 51 is to be fixed, and then, the semiconductor imaging element 51 is fixed to the cavity 22 by the fixing member 30 thereat. In the heat hardening, the central part where the thickness of the layer of the fixing member 30 is large is shrunk and displaced larger than the peripheral part where the thickness of the fixing member 30 is small. As a result, the semiconductor imaging element 51 fixed thereto is deformed in association with shrinkage of the fixing member 30 to be curved. Hence, the face obtained by connecting the vertexes of the micro lenses 16 is formed into a concave curve with the center of the imaging region 13 as a center.

Besides, when the concave curve of the micro lenses 16 is overlaid, which is formed by variation in vertex thickness of the micro lenses 16 as described bout the semiconductor imaging device 10 of Embodiment 1, the face obtained by connecting the vertexes of the micro lenses 16 is further curved. As a result, the shading phenomenon, which darkens the peripheral part of an image of an object and leads to lowering of image quality, can be prevented, attaining a clear and excellent image.

FIG. 8A to FIG. 8G are sectional views for explaining main steps of a method for manufacturing the semiconductor imaging element 51 used in the semiconductor imaging device 60 of Embodiment 3. These steps are performed actually on a semiconductor wafer in which a plurality of semiconductor imaging elements 51 are formed, but only one semiconductor imaging element 51 is indicated in a semiconductor wafer for the sake of drawing drafting.

Figure 8A:
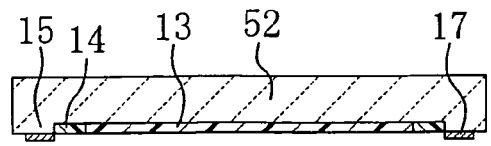
FIG. 8A to FIG. 8G are sectional views for explaining main steps of a method for manufacturing the semiconductor imaging element used in the semiconductor imaging device of Embodiment 3.

First, as shown in FIG. 8A, a semiconductor wafer is prepared in which a plurality of semiconductor imaging elements 51 including the imaging region 13, the peripheral circuit region 14, and the electrode region 15 are formed into a predetermined shape.

Figure 8B:
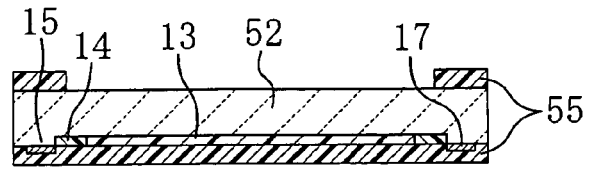

Next, a shown in FIG. 8B, a photoresist film 55 is formed on the entire face of the semiconductor wafer where the imaging region 13 and the like are formed. As well, the photoresist film 55 is formed on the entirety of the opposite face to the face where the imaging region 13 and the like are formed, namely, the reverse face. Then, a region of the photoresist film 55 to be the recess 53 ranging slightly larger than the imaging region 13 and a region thereof to be the trenches 54 for connecting the recess 53 and a part to be the edge of the semiconductor imaging element 51 when diced are exposed by an exposure process and a development process with the use of a photomask (not shown).

Figure 8C:
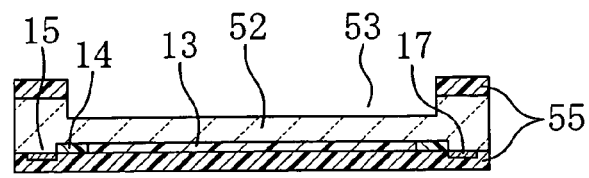

Subsequently, as shown in FIG. 8C, the exposed part of the semiconductor wafer is subjected to wet etching containing, for example, hydrofluoric acid or to dry etching containing a fluorine compound to form the recess 53 and the trenches 54. Then, the photoresist mask 55 is removed. For this removal, a resist removing solution or oxygen plasma may be used, for example. Alternatively, etching may be performed with the use of alkali-based etching solution, such as potassium hydroxide (KOH).

Figure 8D:
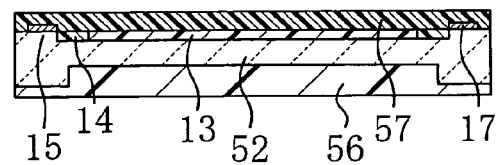

Thereafter, as shown in FIG. 8D, a surface protection film 56 is formed on the reverse face of the semiconductor wafer. Further, a photosensitive acryl-based transparent resin film 57 having a predetermined thickness is formed on the surface where the imaging region 13 is formed. The surface protection film 56 may be a photoresist film or a resin protection film immune to development of the acryl-based transparent resin film 57, and any material may be used only if it is capable of being dissolved and removed by a weak alkaline or acid chemical solution.

Figure 8E:
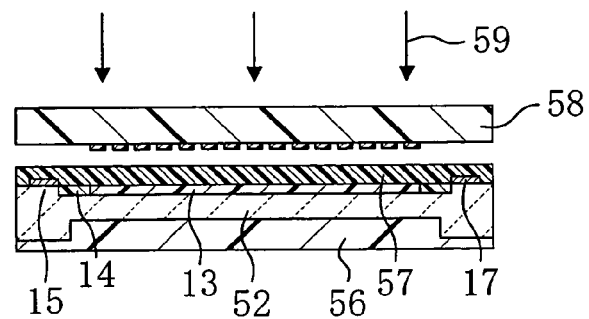

Next, as shown in FIG. 8E, the acryl-based transparent resin film 57 on the imaging region 13 is subjected to irradiation by ultraviolet ray 59 for exposure with the use of a photomask 58 having a pattern corresponding to each pixel in the imaging region 13 of the semiconductor imaging elements 51 in the semiconductor wafer.

Figure 8F:
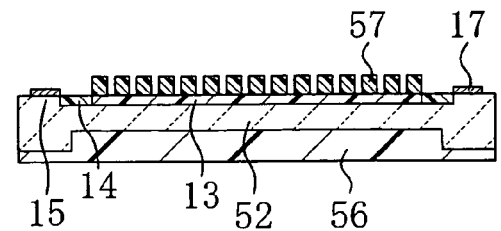

Subsequently, as shown in FIG. 8F, the acryl-based transparent resin film 57 after exposure is developed to obtain the acryl-based transparent resin films 57 separated in pieces on the respective pixels.

Figure 8G:
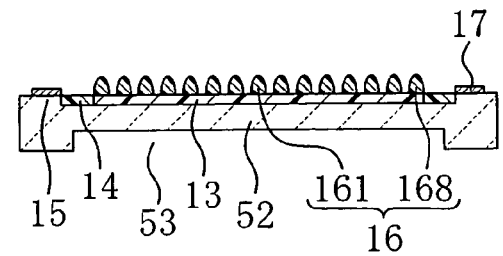

Thereafter, as shown in FIG. 8G, the semiconductor wafer in which the separated acryl-based transparent resin films 57 are formed is subjected to heating for five minutes at 200° C. in a non-oxidation gas atmosphere, for example, in a nitrogen gas. This heating treatment allows the acryl-based transparent resin films 57 to flow and be hardened, thereby forming the micro lenses 16. Finally, the semiconductor wafer is diced into pieces of the semiconductor imaging elements 51 (not shown). In this way, the semiconductor imaging element 51 of the present embodiment is obtained through the above described steps.

It is noted that though the photosensitive acryl-based transparent resin film 57 is separated in pieces in the unit of pixel in the above manufacturing steps, the present invention is not limited thereto. For example, in the case where a non-photosensitive acryl-based transparent resin film is formed, a photoresist film is formed on the acryl-based transparent resin film, and the photoresist film is subjected to exposure and etching to form a predetermined pattern, the acryl-based transparent resin film may be separated by etching using the photoresist film in which the pattern is thus formed as a mask.

According to the above described method for manufacturing the semiconductor imaging element 51, the recess 53 and the trenches 54 can be formed without deforming the micro lenses 16 and without generating a flaw in the micro lenses 16.

FIG. 9A to FIG. 9D are sectional views for explaining main steps of a method for manufacturing a semiconductor imaging device 60 of the present embodiment which uses the semiconductor imaging element 51.

Figure 9A:
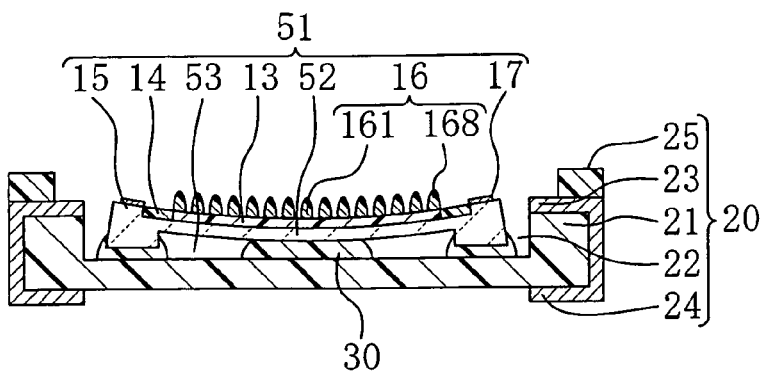
FIG. 9A to FIG. 9D are sectional views for explaining main steps of a semiconductor imaging device manufacturing method of Embodiment 3 in which the semiconductor imaging element is used.

First, as shown in FIG. 9A, an appropriate amount of the fixing member 30 used in Embodiment 1 is applied by, for example, a dispenser, onto four points in the outer peripheral part and one point at the central part in a region of the cavity 22 of the semiconductor package 20 where the semiconductor imaging element 51 is fixed. The material of the fixing member 30 may be liquid polyimide-based resin, acryl-based resin, or the like, or may be semi-hardened epoxy resin, polyimide-based resin, acryl-based resin, or the like in a sheet-like form. Then, the semiconductor imaging element 51 is pressed on an appropriate part of the fixing member 30 for placement, and then, is subjected to heat hardening for five minutes at a temperature between 150° C. and 190° C., preferably 170° C. in a non-oxidation atmosphere, for example, in a nitrogen gas. Whereby, the semiconductor imaging element 51 is fixed in a curved state as shown in the drawing. The above conditions for hardening are mere examples and may be changed appropriately according to the size of the semiconductor package 20, the material of the fixing member 30, and the like. Wherein, the temperature and the time period should be set so as not to volatilize thoroughly the solvent, such as NMP.

Figure 9B:
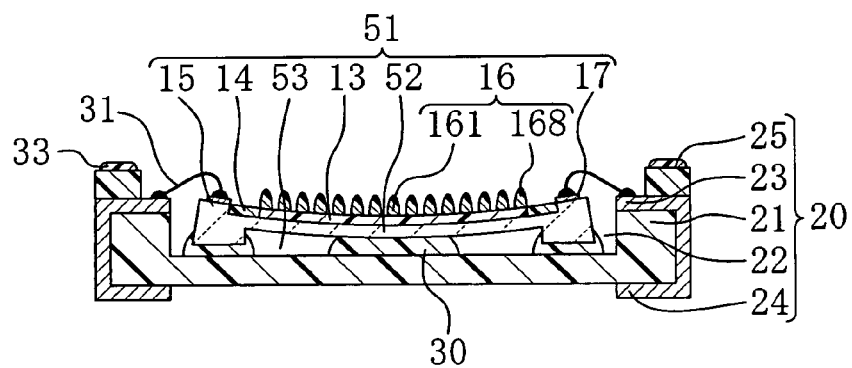

Next, as shown in FIG. 9B, the electrode terminals 17 arranged in the electrode region 15 of the semiconductor imaging element 51 are connected to the internal connection terminals 23 formed inside the periphery of the cavity 22 of the semiconductor package 20 through metal thin lines 31 by, for example, a wire bonder. Gold (Au) lines, copper (Cu) lines, or aluminum (Al) lines may be used as the metal thin lines 31, for example. The wire bonder may be of thermal compression bonding type, ultrasonic thermal compression bonding type, ultrasonic compression bonding type, or the like. Then, the sealing member 33 made of thermoplastic liquid epoxy-based resin is applied onto the sealing face 25 of the semiconductor package 20 by, for example, a dispenser. The sealing member 33 may be made of acryl-based resin or polyimide-based resin.

Figure 9C:
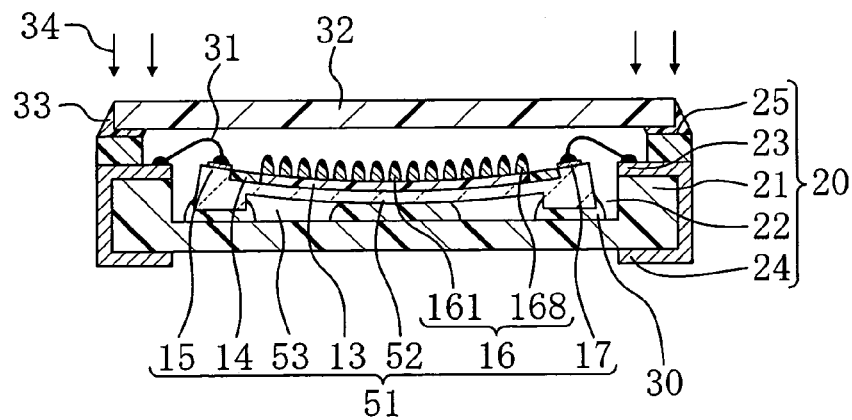

Subsequently, as shown in FIG. 9C, the optical member 32 is pressed on the sealing member 33 applied on the sealing face 25 of the semiconductor package 20 for placement, and first hardening by irradiating the ultraviolet ray 34 is performed. The first hardening is performed by irradiating a ultraviolet ray at approximately 2 joules and then by irradiating a ultraviolet ray at approximately 10 Joules, for example. In the present embodiment, Pyrex (registered trademark) glass is used as the optical member 32.

Figure 9D:
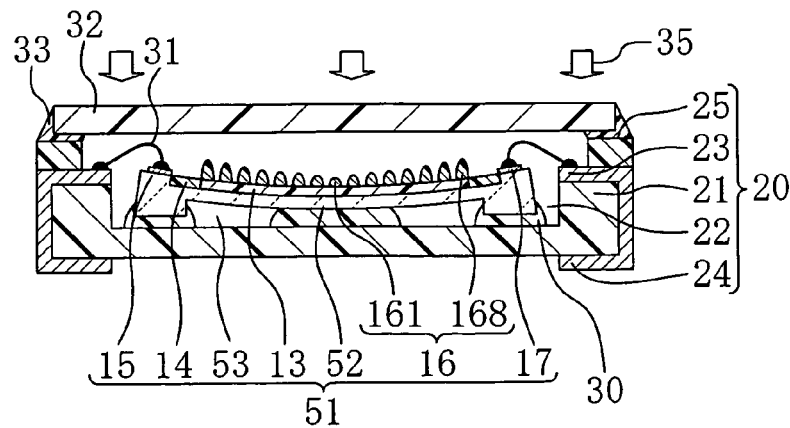

Thereafter, as shown in FIG. 9D, second hardening is performed for heat hardening the sealing member 33 for 60 minutes at a temperature between 110° C. and 130° C., preferably, 120° C. in dry air or a nitrogen gas with the use of, for example, an infrared heater 35 to seal the semiconductor package 20 with the sealing member 33. Through the second hardening, the micro lenses 16 in the central part of the imaging region 13 are deformed to have smaller curvatures while the micro lenses 16 in the outer peripheral part thereof are less deformed, so that the micro lenses 16 form the concave curve as a whole. Through the above described manufacturing steps, a concave shape is obtained in combination of the concave surface of the semiconductor imaging element 51 fixed as above and the concave curve of the micro lenses 16 formed by deformation in thickness of the micro lenses 16. As a result, a shading phenomenon, which darkens the peripheral part of an object of an image with image quality lowered, can be prevented, attaining a clear and excellent image.

It is noted that though the recess 53 ranges slightly wider than the imaging region 13 in the present embodiment, the present invention is not limited thereto and it may range smaller than the imaging region 13.

Embodiment 4

Figure 10A:
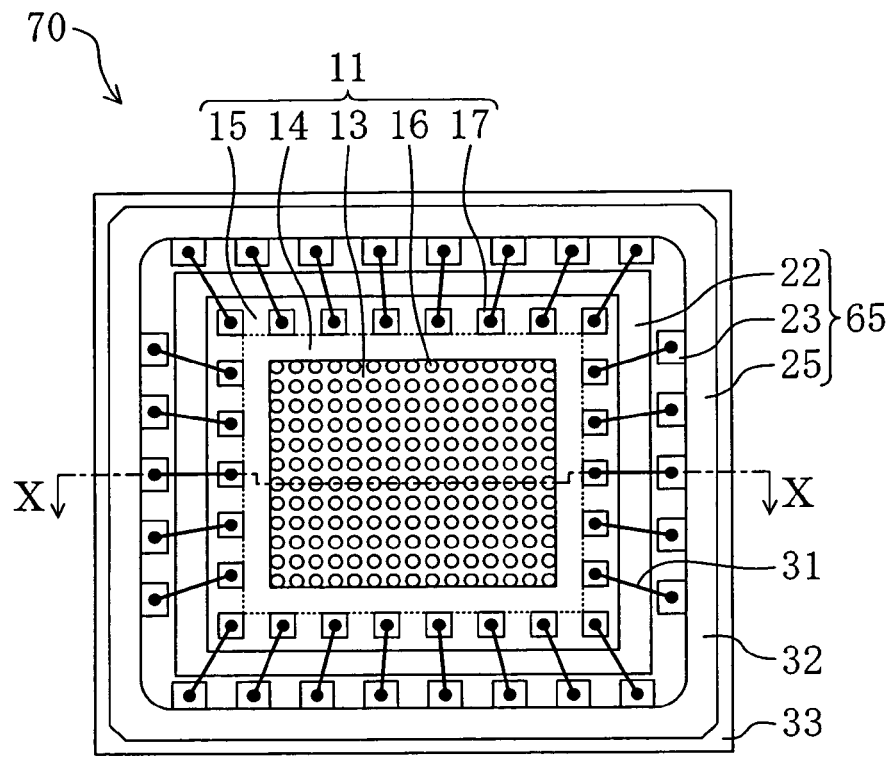
FIG. 10A is a view showing a structure of a semiconductor imaging device according to Embodiment 4 of the present invention and is a plan view when viewed through the optical member.
Figure 10B:
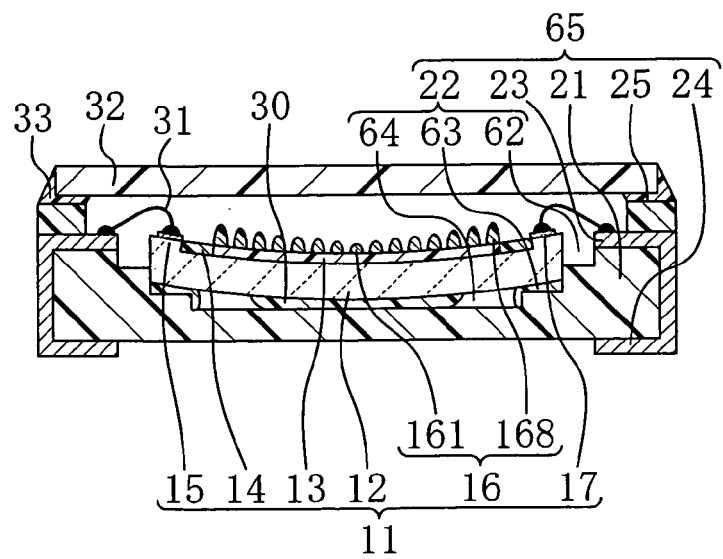
FIG. 10B is a sectional view taken along the line X-X in FIG. 10A.
Figure 11A:
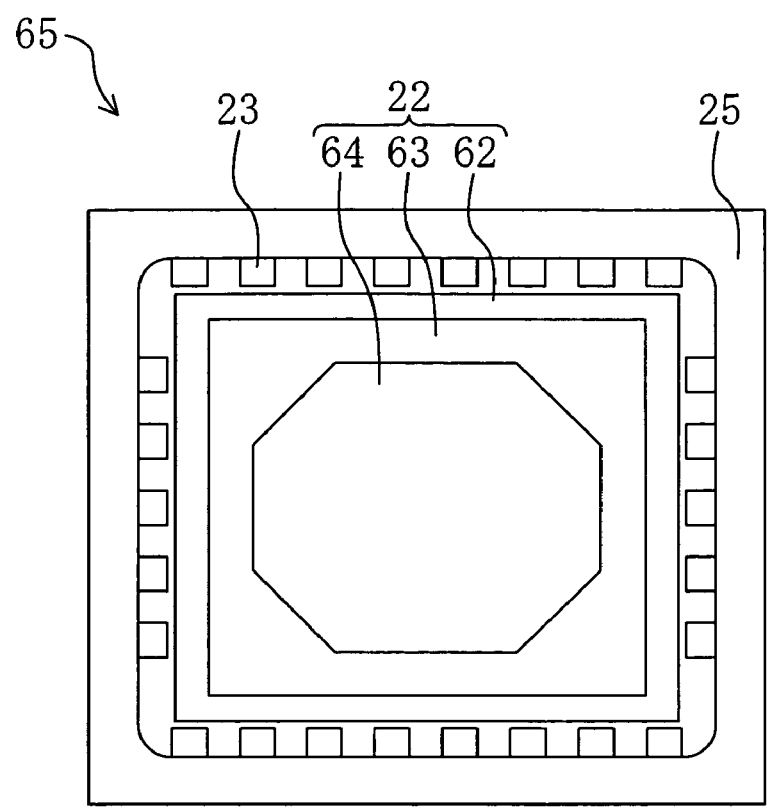
FIG. 11A is a plan view showing a structure of a semiconductor package used in the semiconductor imaging device of Embodiment 4.
Figure 11B:
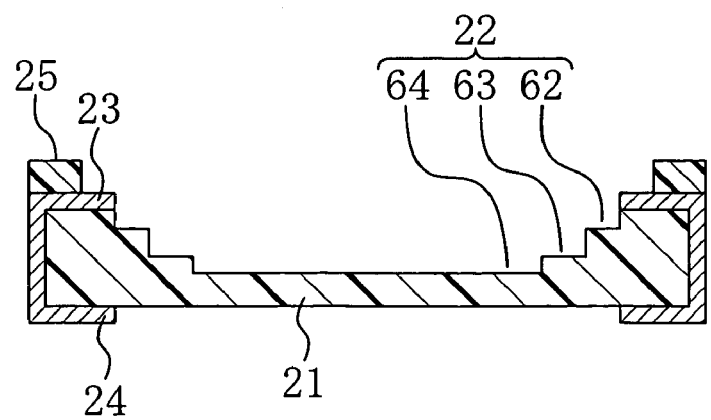
FIG. 11B is a sectional view thereof.

FIG. 10 shows a structure of a semiconductor imaging device 70 according to Embodiment 4 of the present invention, wherein FIG. 10A is a plan view when viewed through the optical member 32, and FIG. 10B is a sectional view taken along the line X-X in FIG. 10A. FIG. 11 shows a structure of a semiconductor package 65 used in the semiconductor imaging device 70, wherein FIG. 11A is a plan view and FIG. 11B is a sectional view taken along the line X-X in FIG. 11A.

The features of the semiconductor imaging device 70 of the present embodiment are as follows. Firstly, the cavity 22 of the semiconductor package 65 is formed to include a first step 62, an element position restricting step 63 in the inner peripheral region of the first step 62, and an element fixing step 64 in the inner peripheral region of the element position restricting step 63. Secondly, when the semiconductor imaging element 11 is fixed to the cavity 22 by the fixing member 30, the semiconductor imaging element 65 is fixed in a curved state by shrinkage stress of the fixing member 30.

In detail, in the cavity 22 of the semiconductor package 65, there are formed the element position restricting step 63 at the bottom thereof for restricting the position of the semiconductor imaging element 11 and the element fixing step 64 inside the element position restricting step 63 which has a form corresponding to at least the imaging region 13 of the semiconductor imaging element 11 and has a depth larger than the depth of the bottom of the element position restricting step 63. The semiconductor imaging element 11 is fitted into the element position restricting step 63 and is fixed to the element fixing step 64 in a curved state with the center of the element fixing step 64 as a center.

The structure of the semiconductor imaging element 70 of the present embodiment will be detailed further in detail. The semiconductor imaging element 11 mounted in the semiconductor imaging device 70 of the present embodiment is the same as that described in Embodiment 1, and therefore, description thereof is omitted while the same reference numerals are assigned. Wherein, the semiconductor imaging element 11 in the present embodiment is preferably thinner than the semiconductor imaging element 11 in Embodiment 1 so as to be easily deformed by shrinkage stress of the fixing member 30.

The semiconductor package 65 used in the semiconductor imaging device 70 is in a rectangular shape in projection, and the cavity 22 is formed in the upper part of the semiconductor package 65 except the sealing face 25 therearound. The cavity 22 is formed so as to include the first step 62, the element position restricting step 63 formed in the inner peripheral region of the first step 62, and the element fixing step 64 formed in the inner peripheral region of the element position restricting step 63. The other features of the semiconductor package 65 are the same as the semiconductor package 20 used in the semiconductor imaging device 10 of Embodiment 1.

The distance from the surface of the inner connection terminals 23 to the bottom of the element position restricting step 63 is set approximately the same as the thickness of the semiconductor imaging element 11. Further, the distance from the bottom of the element position restricting step 63 to the bottom of the element fixing step 64 is set between 20 μm and 250 μm, preferably, 120 μm.

In fixing the semiconductor imaging element 11 to the predetermined position of the thus structured semiconductor package 60, the semiconductor imaging element 51 can be curved by action of the fixing member 30. In detail, the fixing member 30 is applied onto four points at the corners of the bottom of the element position restricting step 63 of the cavity 22 of the semiconductor package 65 and one point at the substantial center of the bottom of the element fixing step 64 thereof by a dispenser or the like. Then, the semiconductor imaging element 11 is fixed to the cavity 22 by the fixing member 30. The layer of the fixing member 30 at the element fixing step 64 is larger in thickness than the layer of the fixing member 30 at the corners of the element position restricting step 63. Accordingly, the layer of the fixing member 30 at the element fixing step 64 shrinks and is deformed at hardening more largely than the fixing member 30 at the corners. As a result, the fixed semiconductor imaging element 11 is deformed by shrinkage of the fixing member 30 to be curved. Thus, the face obtained by connecting the vertexes of the micro lenses 16 is formed into a continuous concave curve with the center of the imaging region 13 as a center.

In the case of the semiconductor imaging device 70 using the above described semiconductor package 65, the semiconductor imaging element 11 can be mounted and fixed in a curved state easily and accurately at a predetermined position of the element position restricting step 63 of the cavity 22. In addition, the effects in Embodiment 1 can be obtained as well, resulting in prevention of a shading phenomenon, which darkens the peripheral part of an object of an image with image quality lowered to attain a clear and excellent image.

A method for manufacturing the semiconductor imaging device 70 of the present embodiment will described next. FIG. 12A to FIG. 12D are sectional views for explaining main steps of the method for manufacturing the semiconductor imaging device 70 according to Embodiment 4.

Figure 12A:
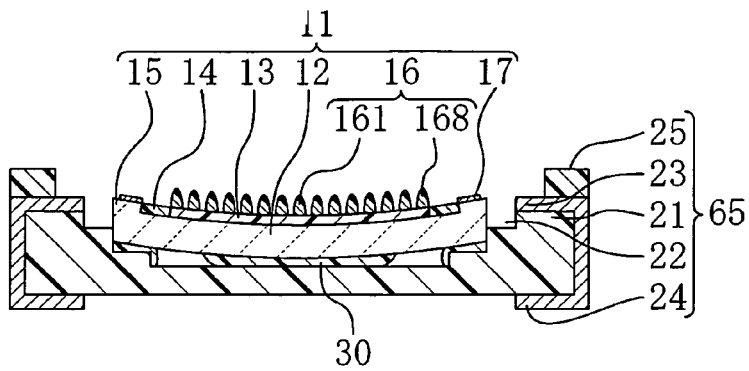
FIG. 12A to FIG. 12D are sectional views for explaining main steps of a semiconductor imaging device manufacturing method according to Embodiment 4.

First, as shown in FIG. 12A, the fixing member 30 is applied by a dispenser or the like onto the four points at the corners of the bottom of the element position restricting step 63 of the cavity 22 of the semiconductor package 65 and one point at the substantial center of the bottom of the element fixing step 64 thereof. Then, the semiconductor imaging element 11 is pressed on the appropriate position of the fixing member 30 for placement, and then, is subjected to heat hardening for five minutes at a temperature between 150° C. and 190° C., preferably, 170° C. in a non-oxidation atmosphere, such as a nitrogen gas. Whereby, the semiconductor imaging element 11 is fixed in a curved state as shown in the drawing. The conditions for hardening are mere examples and may be changed appropriately according to the size of the semiconductor package 65, the material of the fixing member 30, and the like. Wherein, the temperature and the time period should be set so as not to volatilize thoroughly the solvent, such as NMP.

Figure 12B:
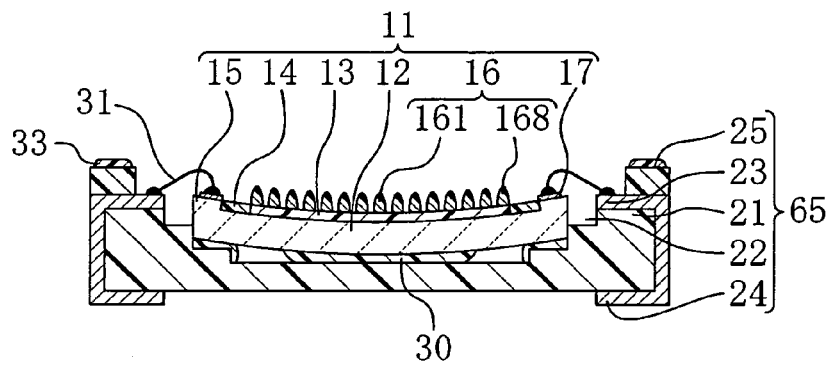

Next, as shown in FIG. 12B, the electrode terminals 17 arranged in the electrode region 15 of the semiconductor imaging element 11 are connected to the internal connection terminals 23 formed inside the periphery of the cavity 22 of the semiconductor package 65 through the metal thin lines 31 by, for example, a wire bonder. Gold (Au) lines, copper (Cu) lines, or aluminum (Al) lines may be used as the metal thin lines 31, for example. The wire bonder may be of thermal compression bonding type, ultrasonic thermal compression bonding type, ultrasonic compression bonding type, or the like. Then, the sealing member 33 made of thermoplastic liquid epoxy-based resin is applied onto the sealing face 25 of the semiconductor package 65 by, for example, a dispenser. The sealing member 33 may be made of acryl-based resin or polyimide-based resin.

Figure 12C:
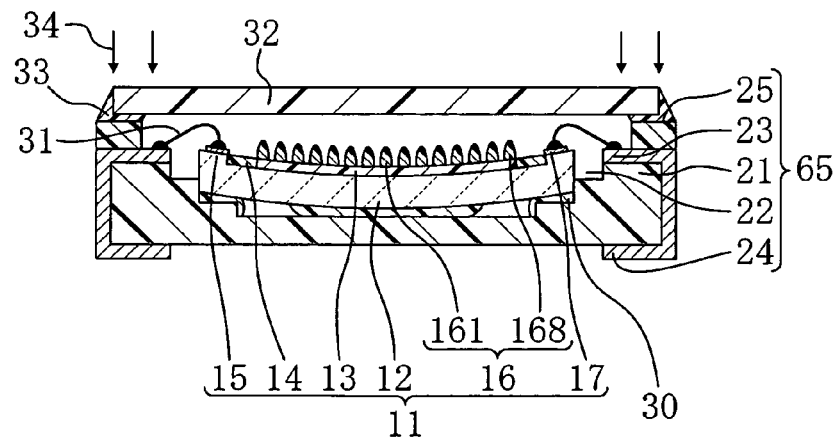

Subsequently, as shown in FIG. 12C, the optical member 32 is pressed on the sealing member 33 applied on the sealing face 25 of the semiconductor package 65 for placement, and is subjected to first hardening by irradiating the ultraviolet ray 34. The fist hardening is performed by irradiating a ultraviolet ray at approximately 2 joules and then by irradiating a ultraviolet ray at approximately 10 Joules, for example. In the present embodiment, Pyrex (registered trademark) glass is used as the optical member 32.

Figure 12D:
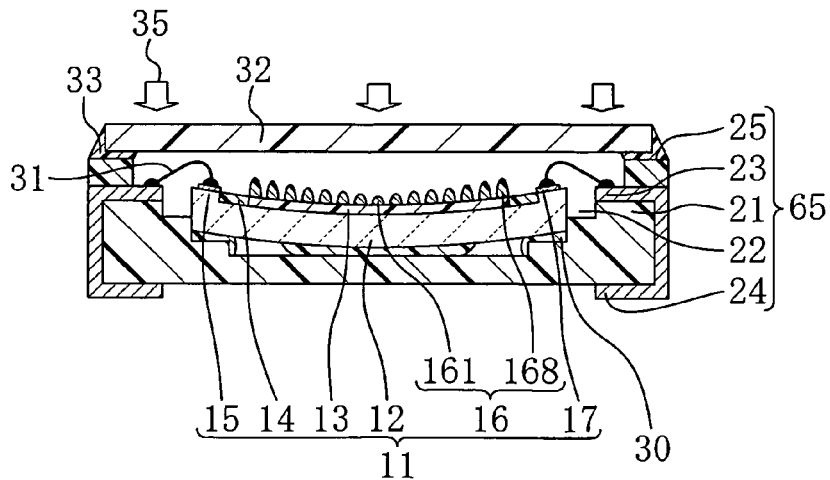

Thereafter, as shown in FIG. 12D, the sealing member 33 is subjected to second hardening, namely, heat hardening for 60 minutes at a temperature between 110° C. and 130° C., preferably, 120° C. with the use of, for example, an infrared heater 35 in dry air or a nitrogen gas to seal the semiconductor package 20 with the sealing member 33. Through the second hardening, the micro lenses 16 in the central part of the imaging region 13 are deformed to have smaller curvatures while the micro lenses 16 in the outer peripheral part thereof are less deformed, so that the micro lenses 16 form a concave curve as a whole. Through the above described manufacturing steps, a concave shape is obtained by overlaying the concave curve of the micro lenses 16 formed by deformation in thickness of the micro lenses 16 with the concave surface of the semiconductor imaging element 51 fixed as above. As a result, a shading phenomenon, which darkens the peripheral part of an object of an image with image quality lowered, can be prevented, attaining a clear and excellent image.

The element fixing step 64 ranges slightly wider than the imaging region 13 in the present embodiment, but the present invention is not limited thereto and may range smaller than the imaging region 13.

In addition, the semiconductor imaging element is fixed by applying the fixing member onto five points of the cavity, namely the four points at the corners of the cavity and one point at the central part thereof in Embodiment 3 and Embodiment 4, but the present invention is not limited thereto. For example, the same effects can be obtained by applying the fixing member to the entire face of the semiconductor imaging element.

As described above, the present invention attains a lightweight and compact semiconductor imaging device that can obtain an excellent image with no shading involved, and therefore, is useful in a field of electronic appliances, such as potable phones, digital cameras, and the like.

What is claimed is:

1. A semiconductor imaging device comprising:
   a semiconductor imaging element including an imaging region, a peripheral circuit region, and an electrode region, the imaging region including a plurality of micro lenses;
   a semiconductor package in which a cavity for mounting the semiconductor imaging element is formed, the semiconductor package including a plurality of internal connection terminals formed inside the periphery of the cavity for being connected with a plurality of electrode terminals of the semiconductor imaging element and a plurality of external connection terminals connected with the internal connection terminals for being connected with an external instrument;
   a fixing member for fixing the semiconductor imaging element to the cavity; and
   an optical member fixed to the semiconductor package by a sealing member so as to cover the semiconductor imaging element arranged in the cavity,
   wherein in the semiconductor imaging element, a semiconductor substrate and the imaging region are flat, the plurality of micro lenses have the same outer dimension, and a face obtained by connecting vertexes of the micro lenses is formed into a continuous concave curve where a micro lens at the center of the imaging region has the smallest curvature while micro lenses at the outermost periphery thereof have the largest curvature and thickness at vertexes of the micro lenses increases continuously from the micro lens at the center to the micro lenses at the outermost periphery.

2. A semiconductor imaging device comprising:
   a semiconductor imaging element including an imaging region, a peripheral circuit region, and an electrode region, the imaging region including a plurality of micro lenses;

a semiconductor package in which a cavity for mounting the semiconductor imaging element is formed, the semiconductor package including a plurality of internal connection terminals formed inside the periphery of the cavity for being connected with a plurality of electrode terminals of the semiconductor imaging element and a plurality of external connection terminals connected with the internal connection terminals for being connected with an external instrument;

a fixing member for fixing the semiconductor imaging element to the cavity; and an optical member fixed to the semiconductor package by a sealing member so as to cover the semiconductor imaging element arranged in the cavity, wherein in the semiconductor imaging element, a face obtained by connecting vertexes of the micro lenses is formed into a continuous concave curve where a micro lens at the center of the imaging region has the smallest curvature while micro lenses at the outermost periphery thereof have the largest curvature and thickness at vertexes of the micro lenses increases continuously from the micro lens at the center to the micro lenses at the outermost periphery, and wherein a recess in a shape corresponding to at least the imaging region and a plurality of trenches having the same depth as the recess for connecting the recess and an edge of the semiconductor imaging element are formed in an opposite surface portion of the semiconductor imaging element to a surface portion where the imaging region is formed, and the semiconductor imaging element is fixed in the cavity in a curved state with a central part of the recess as a center.

3. The semiconductor imaging device of claim 1 or 2, wherein each of the plurality of the micro lenses are made of acryl-based resin, and the fixing member contains at least one selected from the group of liquid epoxy-based resin, liquid polyimide-based resin, and liquid acryl-based resin as a base compound and contains N-methyl-2-pyrolidone as a solvent.

4. The semiconductor imaging device of claim 1 or 2, wherein the sealing member is made of a material hardened by a ultraviolet ray and heating.

5. The semiconductor imaging device of claim 1 or 2, wherein the optical member is made of any of glass, quartz glass, epoxy resin, acryl resin, and polyimide resin which are transparent with respect to at least visible light.

6. The semiconductor imaging device of claim 1 or 2, wherein the fixing member contains a volatile component, and each of the plurality of the micro lenses are made of a material softened by the volatile component contained in the fixing member.

7. The semiconductor imaging device of claim 2, wherein in the cavity of the semiconductor package, there are formed an element position restricting step at the bottom thereof for restricting a position of the semiconductor imaging element and an element fixing step inside the element position restricting step which has a shape corresponding to at least the imaging region of the semiconductor imaging element and which has a depth larger than the bottom of the element position restricting step, and the semiconductor imaging element is fitted in the element position restricting step and fixed to the element fixing step in a curved state with a central part of the element fixing step as a center.

* * * * *